United States Patent
Freda et al.

(10) Patent No.: US 8,237,058 B2
(45) Date of Patent: Aug. 7, 2012

(54) PRINTED CIRCUIT BOARD WITH LOW PROPAGATION SKEW BETWEEN SIGNAL TRACES

(75) Inventors: Michael C. Freda, Morgan Hill, CA (US); Ricki D. Williams, Temecula, CA (US)

(73) Assignee: Oracle America, Inc., Redwood Shores, CA (US)

(*) Notice: Subject to any disclaimer, the term of this patent is extended or adjusted under 35 U.S.C. 154(b) by 167 days.

(21) Appl. No.: 12/775,349

(22) Filed: May 6, 2010

(65) Prior Publication Data

US 2011/0272186 A1    Nov. 10, 2011

(51) Int. Cl.
*H05K 1/00* (2006.01)

(52) U.S. Cl. ......... 174/258; 174/255; 174/261; 174/251

(58) Field of Classification Search .................. 174/250, 174/251, 255.261, 268, 258; 361/760
See application file for complete search history.

(56) References Cited

U.S. PATENT DOCUMENTS

| | | | |
|---|---|---|---|
| 7,056,571 B2* | 6/2006 | Tomekawa et al. | 428/209 |
| 2004/0181764 A1* | 9/2004 | Brist et al. | 716/6 |
| 2004/0262036 A1* | 12/2004 | Brist et al. | 174/261 |
| 2005/0034893 A1* | 2/2005 | McCall et al. | 174/255 |
| 2005/0270755 A1* | 12/2005 | Tsai et al. | 361/760 |
| 2006/0076683 A1* | 4/2006 | Nishida | 257/758 |
| 2006/0254811 A1* | 11/2006 | Kirstein et al. | 174/256 |
| 2007/0178289 A1* | 8/2007 | Cases et al. | 428/209 |
| 2007/0223205 A1* | 9/2007 | Liang et al. | 361/760 |
| 2008/0060836 A1* | 3/2008 | Farkas et al. | 174/250 |
| 2009/0173525 A1* | 7/2009 | Morita | 174/258 |
| 2010/0116530 A1* | 5/2010 | Okazaki | 174/257 |

* cited by examiner

*Primary Examiner* — Hoa C Nguyen
(74) *Attorney, Agent, or Firm* — Park, Vaughan, Fleming & Dowler LLP

(57) ABSTRACT

A printed circuit board (PCB) is configured to minimize skew between two parallel signal trace portions. The PCB comprises a laminate layer, which includes a fiberglass weave and includes a plastic resin deposited on each face of the fiberglass weave to form a first face and second face of the laminate layer. The fiberglass weave comprises a first set of fiberglass bundles in a first orientation interwoven with a second set of fiberglass bundles in a second orientation. Moreover, the PCB comprises trace a layer that is coupled to the first face of the laminate layer, and includes two or more signal traces. Two parallel trace portions of the two or more signal traces are configured to have a matching orientation and separation distance to a neighboring fiberglass bundle of the fiberglass weave, thereby ensuring that the two parallel trace portions encounter matching dielectric constants from the laminate layer.

20 Claims, 3 Drawing Sheets

PRINTED CIRCUIT BOARD WITH LOW PROPAGATION SKEW BETWEEN SIGNAL TRACES

BACKGROUND

1. Field

This disclosure is related to printed circuit boards (PCBs). More specifically, this disclosure relates to a printed circuit board which is configured to minimize skew between parallel signal traces.

2. Related Art

Advances in fabrication technologies continue to increase the performance and maximum throughput of circuit devices. However, enabling the circuit devices to maintain high throughput generally requires that circuit devices communicate with one another at high data rates. The requirement for high data-rate communication between circuit devices is increasing demand for printed circuit boards (PCBs) with interconnects (i.e., signal wires/traces fabricated in the PCB) that can carry communication signals between the circuit devices at high data rates.

One common problem with communicating signals at high data rates in PCBs is skew between the signals. More specifically, many PCBs include pairs of interconnections that simultaneously propagate corresponding pairs of signal values (e.g., a clock/data pair of signals). However, because the propagation time of signals traveling in the interconnect pair can be different due to physical differences in each signal trace in the interconnect pair, the signals can experience different propagation times (i.e., propagation skew), which can cause the circuit devices that depend on the signals to operate incorrectly.

Because many PCBs include two or more layers in which signal traces are routed, one of the main sources for propagation skew is electromagnetic interference between signals on neighboring trace layers of a PCB. More specifically, due to the physical properties of signal traces in these layers (e.g., capacitance and inductance), signals on one trace layer of the PCB can be affected by signal traces in a neighboring trace layer of the PCB. To minimize this cross-layer interference, some PCBs include a laminate layer with an embedded fiberglass weave that has a high dielectric constant. The embedded fiberglass weave helps to reduce the capacitive coupling of signals between the layers.

Unfortunately, even with the embedded fiberglass weave, skew can still be a problem in PCBs. This problem still arises because the dielectric constant can vary across a trace layer of a PCB when some points of the trace layer are near a resin-rich portion of the PCB, while other points are near a fiberglass-rich portion of the PCB. Even these small variations in the laminate layer's dielectric constant can cause sufficient skew between signals to cause errors in high-performance circuit devices.

SUMMARY

The described embodiments provide a printed circuit board (PCB) configured to minimize skew between signals propagated on two parallel signal trace portions. The PCB comprises a laminate layer, which includes a fiberglass weave and a plastic resin deposited on a first face and second face of the fiberglass weave to form a first face and second face of the laminate layer. The fiberglass weave includes a first set of fiberglass bundles in a first orientation interwoven with a second set of fiberglass bundles in a second orientation.

The PCB further comprises a trace layer that is coupled to the first face of the laminate layer, and includes two or more signal traces. In the described embodiments, two parallel trace portions of the two or more signal traces are configured to have a matching orientation and separation distance to a neighboring fiberglass bundle of the fiberglass weave. By configuring the trace portions in this way, the trace portions encounter approximately matching dielectric constants from the laminate layer.

In some embodiments, two neighboring fiberglass bundles in the first set of fiberglass bundles are separated by a first separation distance. In these embodiments, the two parallel trace portions are parallel to the first set of fiberglass bundles and are separated by a multiple of the first separation distance.

In some embodiments, two neighboring fiberglass bundles in the second set of fiberglass bundles are separated by a second separation distance that is different from the first separation distance. In these embodiments, the two parallel trace portions are parallel to the second set of fiberglass bundles and are separated by a multiple of the second separation distance.

In some embodiments, the difference in propagation delay between the two parallel trace portions is at most 2 picoseconds per inch of signal trace.

In some embodiments, the two or more signal traces include a pair of balanced traces that propagate differential signals.

In some embodiments, the two or more signal traces include two equidistant traces that propagate a signal from a common source to two different destinations.

In some embodiments, the first orientation is perpendicular to the second orientation.

In some embodiments, the fiberglass weave includes 60 fiberglass bundles per inch (i.e., an average separation distance of 16.67 mils between neighboring fiberglass bundles) across at least one of the first and second orientations.

In some embodiments, the two parallel trace portions of the trace layer are separated by a multiple of 18 mils.

In some embodiments, the PCB also comprises an additional trace layer coupled to the second face of the laminate layer, such that the additional trace layer includes at least one additional trace portion which has an orientation and separation distance to a neighboring fiberglass bundle which matches that of a trace portion of the trace layer.

Figure 1:
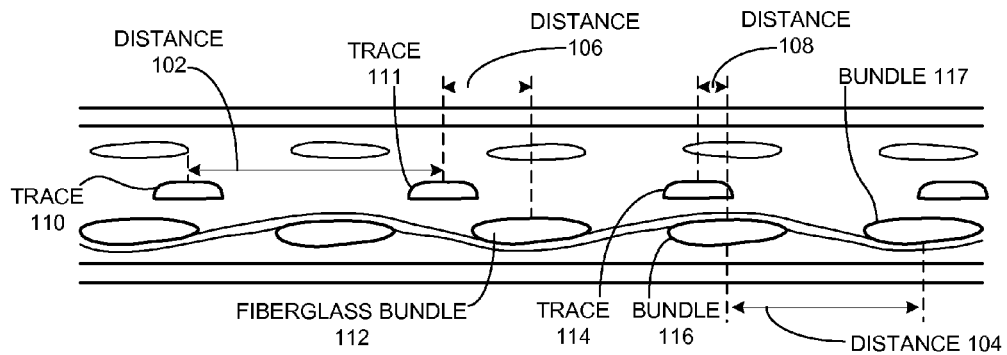
FIG. 1 illustrates a cross-section of a typical printed circuit board.

TABLE 1 presents a listing for typical glass styles of a fiberglass weave in accordance with the described embodiments.

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Typical printed circuit boards (PCBs) include a fiberglass weave within a laminate layer to electrically insulate communication signals that propagate across neighboring trace layers (i.e., to reduce capacitive coupling between the signal traces in the neighboring trace layers). However, as the performance of electronic components increases, even minute variations in a laminate layer's dielectric constant can cause problematic variations in the propagation delay between signal traces.

FIG. 1 illustrates a cross-section of a typical printed circuit board, where two parallel signal traces do not have a constant separation distance to a nearest fiberglass bundle of the PCB's laminate layer. Specifically, traces 110 and 111 have a separation distance 102, which does not match a separation distance 104 between neighboring fiberglass bundles (e.g., fiberglass bundles 116 and 117). As a consequence, the separation distance 106 between trace 111 and its nearest fiberglass bundle 112 is different from the separation distance 108 between trace 114 and fiberglass bundle 116. This can be a problem because trace 114 will experience a larger dielectric constant than trace 111, given that it has a closer proximity to a fiberglass bundle.

Figure 2:
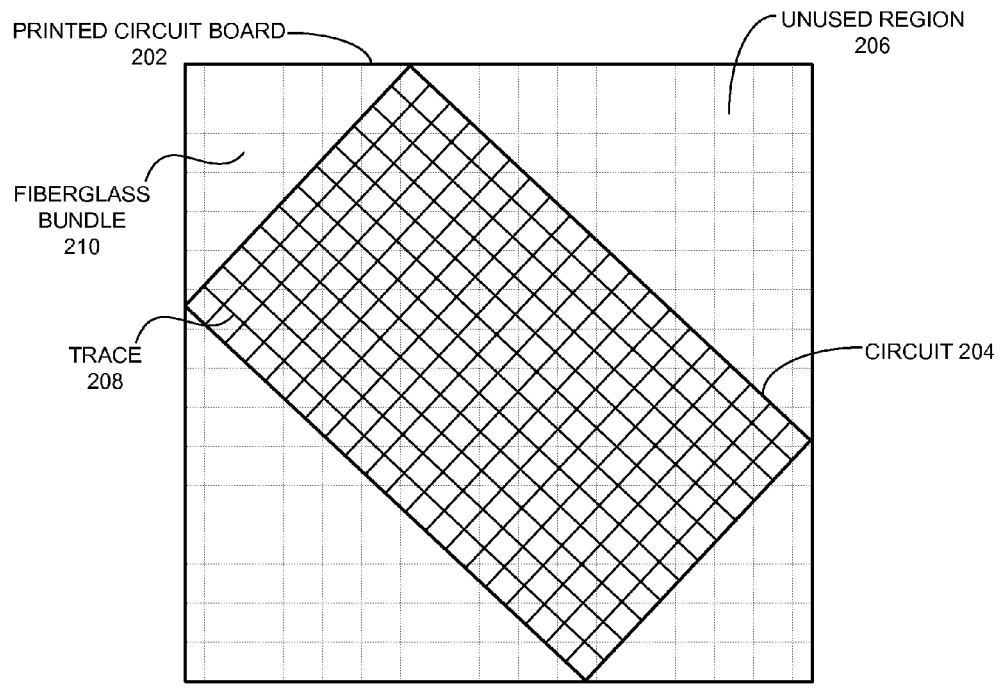
FIG. 2 illustrates a circuit oriented at a diagonal angle relative to fiberglass bundles of a printed circuit board.

Some techniques to alleviate the negative effects that a fiberglass weave has on a signal can provide favorable results, but are not cost effective. For example, FIG. 2 illustrates a circuit oriented at a diagonal angle relative to fiberglass bundles of a printed circuit board 202. Specifically, printed circuit board 202 includes a fiberglass weave with fiberglass bundles oriented perpendicularly (e.g., fiberglass bundle 210, illustrated as a vertical dotted line). Also notice circuit 204, which includes signal traces that are oriented at a diagonal orientation to the fiberglass bundles of the laminate layer (e.g., trace 208, illustrated as a solid line).

The diagonal orientation of a signal trace with respect to a fiberglass bundle is intended to cause every trace of circuit 204 to encounter a similar dielectric constant from the laminate layer. Unfortunately, to minimize the skew in propagation delay between two signal traces, each trace needs to be oriented at a 45 degree angle to the fiberglass bundles so that the average dielectric constant is the same across all traces. This is not a cost-effective solution because fiberglass weaves are manufactured as a spool with fiberglass bundles that are parallel and perpendicular to the side of the spool. In other words, manufacturing circuit 204 at a 45 degree orientation of PCB 202 results in large unused regions of PCB 202 (e.g., unused region 206), which increases the manufacturing costs for each PCB.

Figure 3:
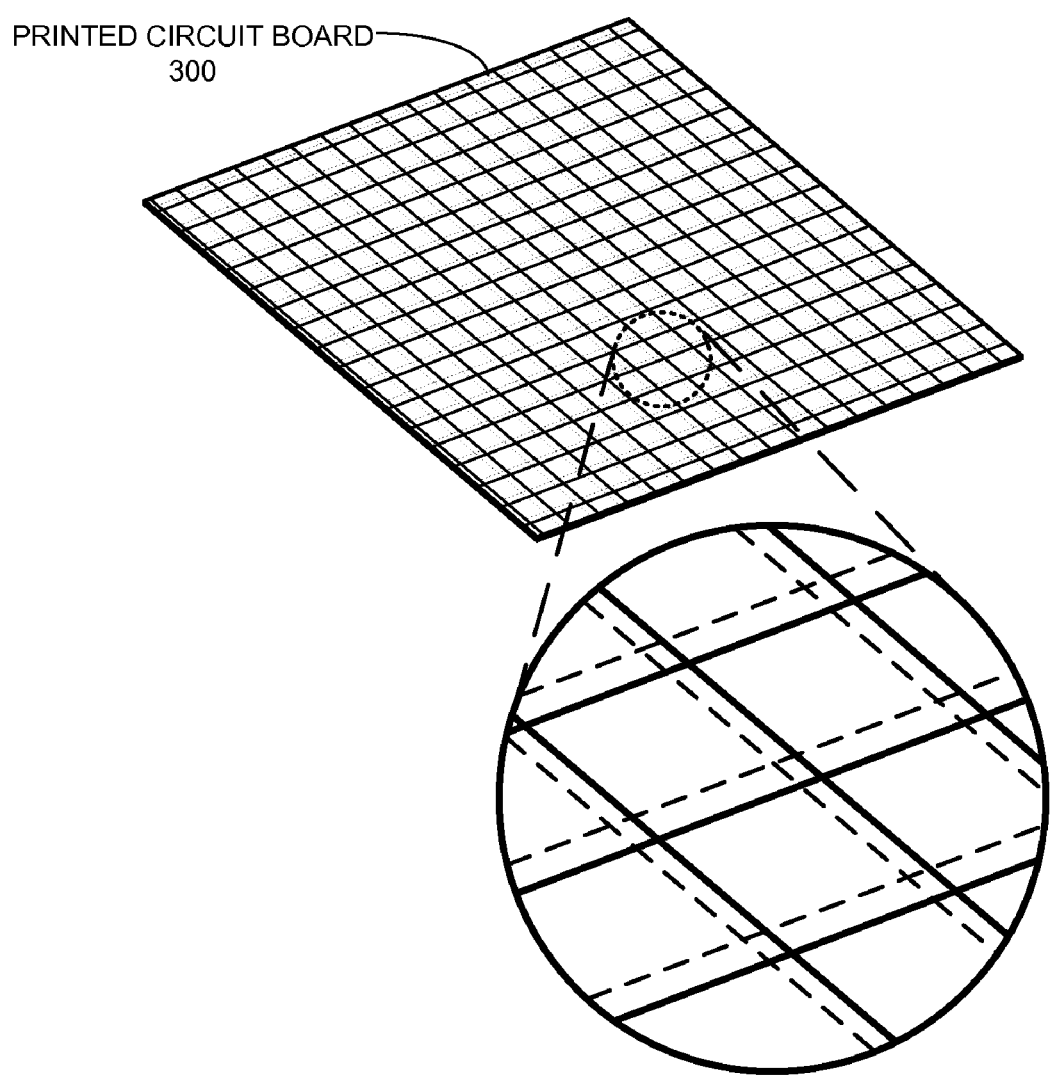
FIG. 3 presents an isometric view of a printed circuit board (PCB) in accordance with the described embodiments.

FIG. 3 presents an isometric view of a printed circuit board (PCB) 300 in accordance with the described embodiments. For illustration purposes, FIG. 3 illustrates a plurality of signal traces for PCB 300 as a grid of solid lines, and illustrates the fiberglass weave as a grid of dotted lines. For example, the plurality of signal traces can include circuit wires that electrically connect several digital components of a personal computer (PC) motherboard.

Signal skew, or the difference in arrival times of bits simultaneously transmitted over a pair of signal traces, can cause digital components to malfunction. In the described embodiments, the signal traces for high-speed communication signals are placed on the PCB in a manner that minimizes the parasitic effects from the PCB that can cause signal skew. More specifically, any two parallel signal traces have an approximately matching distance to a neighboring fiberglass bundle, which minimizes the signal skew between two parallel signal trace portions. Furthermore, the signal traces of PCB 300 can be approximately parallel to the fiberglass bundles of the fiberglass weave, which facilitates maximizing the region of PCB 300 that is used for implementing a circuit.

In the remainder of this disclosure, a "matching" orientation and/or separation distance between trace portions and/or fiberglass bundles includes an approximately matching orientation or an approximately matching separation distance that is within a predetermined tolerance (e.g., 3, 5, or 10 mils). Further, a "parallel" or "perpendicular" orientation between trace portions and/or fiberglass bundles includes an approximately parallel or an approximately perpendicular orientation (e.g., within 3, 5, or 10 degrees of parallel or perpendicular), respectively.

Figure 4A:
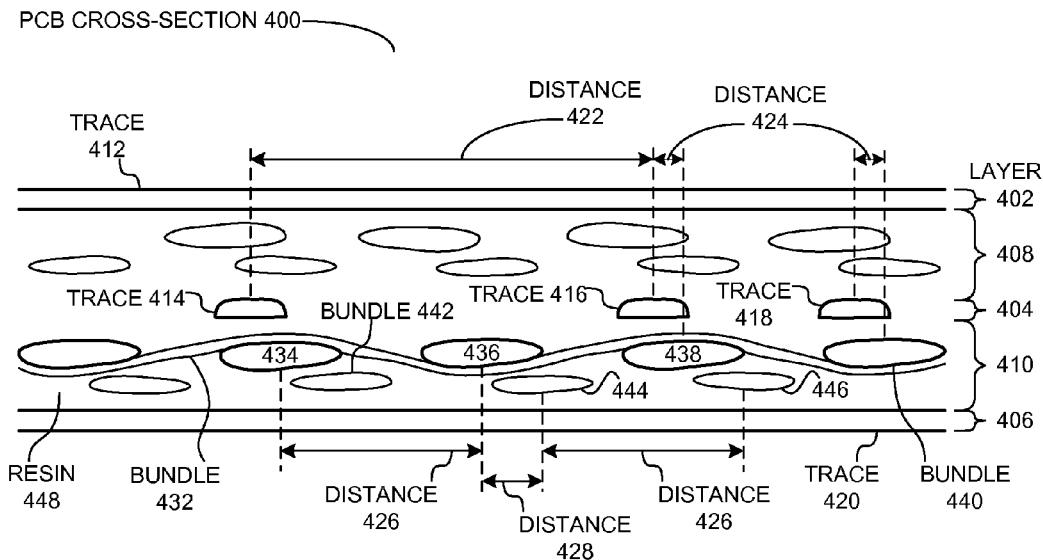
FIG. 4A illustrates an exemplary PCB cross-section in accordance with the described embodiments.

FIG. 4A illustrates an exemplary PCB cross-section 400 in accordance with the described embodiments. PCB cross-section 400 includes trace layers 402-406 which are coupled to laminate layers 408-410 to form the PCB.

Each laminate layer (e.g., laminate layer 410) includes a fiberglass weave, which includes a first set of fiberglass bundles oriented in a first orientation (e.g., fiberglass bundle 432) that are interwoven with a second set of fiberglass bundles oriented in a second orientation (e.g., fiberglass bundles 434-440). Interwoven, as used in this description, denotes a crossing pattern where the fiberglass bundles in a first orientation are interlaced with bundles in a second orientation to form a fiberglass weave. For example, in some embodiments, the fiberglass bundles that are oriented in the first orientation are perpendicular to the fiberglass bundles that are oriented in the second orientation.

The laminate layer also includes a plastic resin (e.g., resin 448) that is deposited on each face of the fiberglass weave to form a first face and second face of the laminate layer.

Furthermore, a trace layer of the PCB is coupled to a face of at least one laminate layer, and includes two or more signal traces oriented in at least one orientation (e.g., signal traces 414-418 on trace layer 404 are approximately parallel to fiberglass bundles 434-440 of laminate layer 410).

In the described embodiments, signal traces of trace layer 404 can include a pair of balanced traces that propagate differential signals. More specifically, the balanced traces can include two equidistant traces that propagate complementary signals from a source (i.e., circuit device) to a destination. During operation, a transmitting device encodes a sequence of signal values into two complementary signals that propagate simultaneously across the pair of balanced traces. Then, a receiving device of the complementary signals will typically compute the difference in signal values between the two complementary signals to determine the initial sequence of signal values. In these embodiments, because the complementary signals are required to propagate simultaneously from the source to the destination, a skew in the propagation between the two complementary signals can cause their signal values to be decoded incorrectly.

Moreover, signal traces of trace layer 404 can include two equidistant traces that propagate a signal from a common source to two different destinations. For example, two equidistant signal traces can be configured to propagate a high-speed clock signal to two different synchronous devices of a computing device (e.g., to a microprocessor and a graphics processing unit), such that the high-speed clock signal ensures that the communication between the two devices remains synchronized. During operation, variations in the dielectric constant throughout a laminate layer of a typical PCB can introduce a signal skew between clock signals that propagate across two equidistant traces. This clock skew can cause a delay in the communication between the two devices, and can even cause communication errors between the two devices. In the described embodiments, PCB 400 minimizes signal skew between two parallel signal trace portions, which increases the ability of a signal to propagate through two equidistant traces simultaneously.

In the described embodiments, two parallel trace portions (e.g., traces 416-418) are configured to have a matching orientation and separation distance to a neighboring fiberglass bundle of the fiberglass weave (e.g., a distance 424 to fiberglass bundles 438-440). For example, two neighboring fiberglass bundles of laminate layer 410 (e.g., fiberglass bundles 434-436, and fiberglass bundles 444-446) are separated by a separation distance 426. Moreover, two parallel trace portions of trace layer 404 (e.g., trace 414 and trace 416) are separated by a multiple of distance 426, and can be parallel to these fiberglass bundles of laminate layer 410. This configuration ensures that the two parallel trace portions encounter approximately matching dielectric constants from the laminate layer, which ensures that signals propagated on the two parallel trace portions are affected by approximately the same parasitic capacitance. This matching parasitic capacitance for signals propagating on the two parallel trace portions minimizes the signal skew between the two parallel trace portions. For example, in some embodiments, the difference in propagation delay between the two parallel trace portions is at most 2 picoseconds per inch of signal trace.

Recall that a fiberglass weave includes one set of fiberglass bundles oriented in a first orientation, and includes a second set of fiberglass bundles oriented in a second orientation, such that the first orientation can be perpendicular to the second orientation. In some variations, the separation distance between two neighboring fiberglass bundles that are oriented in the first orientation matches the separation distance between two neighboring fiberglass bundles that are oriented in the second orientation. When a fiberglass weave has this configuration, two parallel trace portions of a trace layer are configured to have a separation distance that is a multiple of the fiberglass bundle separation distance, regardless of the orientation for these trace portions with respect to the fiberglass weave.

In some embodiments, two neighboring fiberglass bundles that are oriented in the first orientation of the fiberglass weave have a different separation distance than two neighboring fiberglass bundles that are oriented in the second orientation. For example, the fiberglass weave can be a glass style 1080, which includes 60 fibers per inch (i.e., an average separation distance of 16.67 mils between fibers) along the first orientation, and 47 fibers per inch (i.e., an average separation distance of 21.28 mils between fibers) along the second orientation. When a fiberglass weave has this configuration, two parallel trace portions that are oriented in the first orientation are configured to have a separation distance that is a multiple of the fiberglass bundle separation distance for the first orientation. Furthermore, two parallel trace portions that are oriented in the second orientation are configured to have a separation distance that is a multiple of the fiberglass bundle separation distance for the second orientation.

In the described embodiments, a PCB can include a plurality of trace layers, such that a laminate layer is coupled between two neighboring trace layers. Each trace layer includes at least one trace portion which has an orientation and separation distance relative to at least one neighboring fiberglass bundle which matches that of a trace portion of other trace layers. Furthermore, a laminate layer of the PCB can include a plurality of fiberglass weaves that have a matching weave pattern and optionally a matching orientation.

For example, signal trace 416 has a parallel orientation to fiberglass bundle 438, and has a separation distance 426. Similarly, signal trace 420 of trace layer 406 has a parallel orientation to fiberglass bundle 432, and has a separation distance that matches distance 424.

Furthermore, laminate layer 410 includes a set of parallel fiberglass bundles 434-440 that correspond to a top fiberglass weave, and can include a second set of parallel fiberglass bundles 442-446 that correspond to a second fiberglass weave. More specifically, the separation distance between two neighboring fiberglass bundles of the top weave (i.e., distance 426 between bundles 434-436) matches the separation distance of fiberglass bundles of the second weave (i.e., distance 426 between bundles 444-446). Moreover, fiberglass bundles 434-440 of the top weave can be parallel to fiberglass bundles 442-446 of the second weave.

In some variations, two fiberglass weaves of a laminate layer can have a matching pattern and orientation, without requiring the two fiberglass weaves to have a matching alignment. For example, the placement of fiberglass bundle 436 of the top weave can be offset from the placement of fiberglass bundle 444 of the bottom weave by a distance 428. In some other variations, two fiberglass weaves of a laminate layer can have a matching pattern, without having a matching orientation. For example, the orientation of fiberglass bundles 434-438 of the top weave can be offset from the orientation of fiberglass bundles 442-446 of the bottom weave by any angle. This non-uniform orientation between two fiberglass weaves of a laminate layer can further reduce a skew between two parallel signals of a trace layer, given that at least one of the two fiberglass weaves is oriented at a diagonal angle to trace portions of the trace layer.

In some further variations, two fiberglass weaves of a laminate layer can have different glass styles. This configuration can further reduce the percentage of a laminate layer that is rich with resin, thereby ensuring that the wide distribution of fiberglass bundles across the laminate layer achieves a high dielectric constant across the laminate layer.

It is typical for a fiberglass weave to not be manufactured with the same precision that is achieved when manufacturing a trace layer of a PCB. Therefore, it is likely that the separation distance between two neighboring parallel fiberglass bundles of a fiberglass weave has a larger variance than that of two neighboring parallel traces of a trace layer. For example, two neighboring parallel fiberglass bundles may have a separation distance that varies along an axis of the weave, such that each fiberglass bundle may not follow a straight line. However, because a fiberglass weave is designed to have a constant number of fiberglass bundles per inch across the weave, the average separation distance between neighboring parallel fiberglass bundles is constant across different portions of the fiberglass weave.

In the described embodiments, the separation distance between two parallel signal traces on a trace layer of a PCB is configured to correspond to the density of fiberglass bundles (i.e., the number of fiberglass bundles per inch) for the fiberglass weave of the PCB. For example, the fiberglass weave can include 60 fiberglass bundles per inch across at least one of the first and second orientations. Accordingly, the parallel trace portions of the trace layer are configured to have a trace-to-trace separation distance that is a multiple of 16.67 mils. In some variations, the trace-to-trace separation distance is a multiple of at most 18 mils. This configuration achieves an even distribution of signal traces along an axis of a trace layer, which ensures that the average separation between a signal trace and a nearest parallel fiberglass bundle is within an allowable threshold across all signal traces on the trace layer.

Figure 4B:
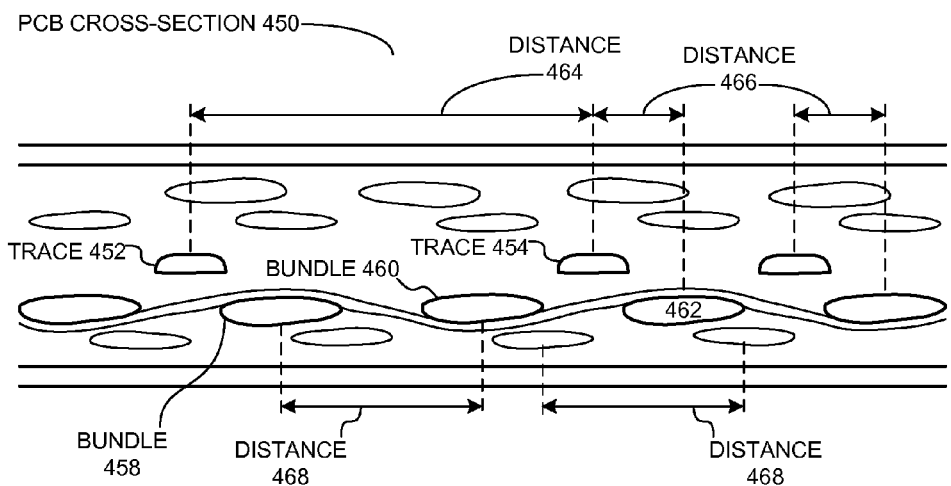
FIG. 4B illustrates an exemplary PCB cross-section in accordance with the described embodiments.

FIG. 4B illustrates an exemplary PCB cross-section 450 in accordance with the described embodiments. More specifically, PCB cross-section 450 illustrates a variation of PCB cross-section 400 of FIG. 4A, such that the separation distance 466 between signal trace 454 and the nearest fiberglass bundle 462 is different than separation distance 424 of PCB cross-section 400. However, similar to PCB cross-section 400, the separation distance between two parallel signal traces (e.g., distance 464 between signal traces 452 and 454) is a multiple of the separation distance between two neighboring fiberglass bundles (e.g., distance 468 between fiberglass bundles 458 and 460).

TABLE 1 presents a listing for typical glass styles of a fiberglass weave in accordance with the described embodiments. This listing for typical glass styles is incorporated from *Electronic Packaging: Materials and Their Properties*, by M. G. Pecht, et al., CRC Press LLC, 1999, which is hereby incorporated by reference for describing fiber orientations in given glass styles. Note that the warp orientation corresponds to the orientation for warp fiberglass bundles (e.g., bundle 432 of FIG. 4A) that are woven with an alternating over and under pattern across consecutive fill fiberglass bundles. Similarly, the fill orientation corresponds to the orientation of fill bundles (e.g., bundles 434-440 of FIG. 4A) that are placed into the fiberglass weave by a side-scrolling shuttle of a weaving loom that travels from one side of the loom to the other.

Also note that the warp dimension of a fiberglass weave is formed by the grain being pulled through a treater, and thus a fiberglass bundle oriented in the warp dimension tends to be thinner than a fiberglass bundle oriented in the fill dimension.

The first column of TABLE 1 lists an identifier for each glass style of a fiberglass weave. The second column of TABLE 1 lists the bundle count per inch across the warp and fill orientations of a fiberglass weave. Finally, the third column lists the thickness of a fiberglass weave.

TABLE 1

| Style | Count (Warp × Fill**)/inch | Thickness (mils) |
|---|---|---|
| 101.00 | 74 × 74 | 0.79 |
| 104.00 | 60 × 52 | 1.1 |
| 106.00 | 56 × 56 | 1.3-1.4 |
| 108.00 | 60 × 47 | 2.4 |
| 112.00 | 40 × 39 | 3.6 |
| 113.00 | 60 × 64 | 3.4 |
| 116.00 | 60 × 58 | 4 |
| 119.00 | 54 × 50 | 3.6 |
| 1027.00 | 75 × 75 | 0.75 |
| 1035.00 | 65 × 67 | 1.2 |
| 1037.00 | 69 × 71 | 0.94 |
| 1067.00 | 70 × 70 | 1.3 |
| 1070.00 | 60 × 35 | 1.8 |
| 1078.00 | 53 × 53 | 1.7 |
| 1080.00 | 60 × 47 | 2.1-2.2 |
| 1116.00 | 60 × 58 | 3.5 |
| 1165.00 | 60 × 52 | 4 |
| 1180.00 | 60 × 50 | 2.3 |
| 1316.00 | 61 × 61 | 3.8 |
| 1501.00 | 46 × 45 | 5.5 |
| 1504.00 | 60 × 50 | 4.8 |
| 1652.00 | 52 × 52 | 4.5 |
| 1675.00 | 40 × 32 | 4 |
| 2112.00 | 40 × 39 | 3.2 |
| 2113.00 | 60 × 56 | 3.1 |
| 2116.00 | 60 × 58 | 3.7 |
| 2125.00 | 40 × 39 | 3.6 |
| 2313.00 | 60 × 64 | 3.3 |
| 2316.00 | 61 × 61 | 3.8 |
| 2319.00 | 60 × 46 | 3.4 |
| 3070.00 | 70 × 70 | 3.1 |
| 3313.00 | 60 × 62 | 3.0-3.3 |
| 7627.00 | 44 × 30 | 6.5 |
| 7628.00 | 44 × 32 | 6.8-7.1 |
| 7629.00 | 44 × 34 | 7.1 |
| 7637.00 | 44 × 22 | 8.8 |
| 7642.00 | 44 × 20 | 10 |
| 7652.00 | 32 × 32 | 8.7 |
| 7655.00 | 44 × 23 | 7.5 |
| 7660.00 | 30 × 30 | 5.9 |

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A printed circuit board, comprising:
a laminate layer, comprising:
a fiberglass weave comprising a first set of fiberglass bundles in a first orientation interwoven with a second set of fiberglass bundles in a second orientation to form a plane that includes a first face;
a second fiberglass weave comprising a third set of fiberglass bundles, wherein a separation distance between two fiberglass bundles in the third set matches a separation distance between two fiberglass bundles in the first or the second set; and
a plastic resin deposited on the first face of the fiberglass weave to form a first face of the laminate layer; and
a trace layer coupled to the first face of the laminate layer, the trace layer comprising two or more signal traces, wherein two parallel trace portions of the two or more signal traces are configured to have a matching orientation and separation distance to a neighboring fiberglass bundle of the fiberglass weave.

2. The printed circuit board of claim 1, wherein two neighboring fiberglass bundles in the first set of fiberglass bundles are separated by a first separation distance;
wherein the two parallel trace portions are parallel to the first set of fiberglass bundles; and
wherein the two parallel trace portions are separated by a multiple of the first separation distance.

3. The printed circuit board of claim 1, wherein the difference in propagation delay between the two parallel trace portions is less than a predetermined time duration per inch of signal trace.

4. The printed circuit board of claim 1, wherein the two or more signal traces include a pair of balanced traces that propagate differential signals.

5. The printed circuit board of claim 1, wherein the two or more signal traces include two equidistant traces that propagate a signal from a common source to two different destinations.

6. The printed circuit board of claim 1, wherein the first orientation is perpendicular to the second orientation.

7. The printed circuit board of claim 1, wherein the two parallel trace portions of the trace layer are separated by a multiple of 18 mils.

8. The printed circuit board of claim 1, wherein the plane of the fiberglass weave includes a second face; and
wherein the printed circuit board further comprises:
a plastic resin deposited on the second face of the fiberglass weave to form a second face of the laminate layer; and
an additional trace layer coupled to the second face of the laminate layer;
wherein the additional trace layer includes at least one additional trace portion which has an orientation and separation distance to a neighboring fiberglass bundle which matches that of a trace portion of the trace layer.

9. A method of producing a printed circuit board, the method comprising:
interweaving a first set of fiberglass bundles in a first orientation with a second set of fiberglass bundles in a second orientation to form a fiberglass weave, wherein the fiberglass weave comprises a plane that includes a first face;
coupling a second fiberglass weave to the fiberglass weave, the second fiberglass weave comprising a third set of fiberglass bundles, wherein a separation distance between two fiberglass bundles in the third set matches a separation distance between two fiberglass bundles in the first or the second set;
depositing a plastic resin on the first face of the fiberglass weave to form a first face of a laminate layer; and
coupling a trace layer to the first face of the laminate layer, the trace layer comprising two or more signal traces, wherein two parallel trace portions of the two or more signal traces are configured to have a matching orientation and separation distance to a neighboring fiberglass bundle of the fiberglass weave.

10. The method of claim 9, wherein two neighboring fiberglass bundles in the first set of fiberglass bundles are separated by a first separation distance;
wherein the two parallel trace portions are parallel to the first set of fiberglass bundles; and
wherein the two parallel trace portions are separated by a multiple of the first separation distance.

11. The method of claim 9, wherein the difference in propagation delay between the two parallel trace portions is less than a predetermined time duration per inch of signal trace.

12. The method of claim 9, wherein the two or more signal traces include a pair of balanced traces that propagate differential signals.

13. The method of claim 9, wherein the two or more signal traces include two equidistant traces that propagate a signal from a common source to two different destinations.

14. The method of claim 9, wherein the first orientation is perpendicular to the second orientation.

15. The method of claim 9, wherein the two parallel trace portions of the trace layer are separated by a multiple of 18 mils.

16. The method of claim 9, wherein the plane of the fiberglass weave includes a second face; and
wherein the method further comprises:
depositing a plastic resin on the second face of the fiberglass weave to form a second face of the laminate layer; and
coupling an additional trace layer to the second face of the laminate layer;
wherein the additional trace layer includes at least one additional trace portion which has an orientation and separation distance to a neighboring fiberglass bundle which matches that of a trace portion of the trace layer.

17. An electronic device, comprising:
an electronic component comprising at least one interconnection pin;
a laminate layer, comprising:
a fiberglass weave comprising a first set of fiberglass bundles in a first orientation interwoven with a second set of fiberglass bundles in a second orientation to form a plane that includes a first face;
a second fiberglass weave comprising a third set of fiberglass bundles, wherein a separation distance between two fiberglass bundles in the third set matches a separation distance between two fiberglass bundles in the first or the second set; and
a plastic resin deposited on the first face of the fiberglass weave to form a first face of the laminate layer; and
a trace layer coupled to the first face of the laminate layer, the trace layer comprising two or more signal traces, wherein two parallel trace portions of the two or more signal traces are configured to have a matching orientation and separation distance to a neighboring fiberglass bundle of the fiberglass weave;
wherein the at least one interconnection pin of the electronic component is electrically coupled to at least one signal trace of the trace layer.

18. The electronic device of claim 17, wherein two neighboring fiberglass bundles in the first set of fiberglass bundles are separated by a first separation distance;
wherein the two parallel trace portions are parallel to the first set of fiberglass bundles; and
wherein the two parallel trace portions are separated by a multiple of the first separation distance.

19. The electronic device of claim 17, wherein the difference in propagation delay between the two parallel trace portions is less than a predetermined time duration per inch of signal trace.

20. The electronic device of claim 17, wherein the two or more signal traces include a pair of balanced traces that propagate differential signals.

* * * * *